(12) United States Patent
Moussaoui et al.

(10) Patent No.: US 7,471,133 B1
(45) Date of Patent: Dec. 30, 2008

(54) MODULATOR CIRCUIT WITH LINEAR AND NON-LINEAR CONTROL

(75) Inventors: Zaki Moussaoui, Fes (MA); Weihong Qiu, San Jose, CA (US)

(73) Assignee: Intersil Americas Inc., Milpitas, CA (US)

( * ) Notice: Subject to any disclaimer, the term of this patent is extended or adjusted under 35 U.S.C. 154(b) by 44 days.

(21) Appl. No.: 11/683,215

(22) Filed: Mar. 7, 2007

Related U.S. Application Data

(60) Provisional application No. 60/807,972, filed on Jul. 21, 2006.

(51) Int. Cl.
*H03K 3/017* (2006.01)
(52) U.S. Cl. .................................................. 327/172
(58) Field of Classification Search ................. 327/172, 327/174
See application file for complete search history.

(56) References Cited

U.S. PATENT DOCUMENTS

| 6,057,675 | A * | 5/2000 | Tateishi | 323/283 |
| 7,378,889 | B2 * | 5/2008 | Wu | 327/176 |
| 2007/0013356 | A1 * | 1/2007 | Qiu et al. | 323/288 |

* cited by examiner

*Primary Examiner*—Jeffrey S Zweizig
(74) *Attorney, Agent, or Firm*—Gary R Stanford

(57) ABSTRACT

A modulator control circuit including a linear control circuit, a non-linear control circuit, and a combiner. The linear control circuit has an input receiving a compensation signal indicative of an output parameter and an output providing a first control signal. The non-linear control circuit has an input receiving the compensation signal and an output providing a second control signal. The non-linear control circuit senses transients of the compensation signal not otherwise detected by the linear control circuit and asserts the second control signal indicative thereof. The combiner combines the first and second control signals to provide a pulse width modulation signal for controlling the output parameter, such as output voltage or the like.

11 Claims, 14 Drawing Sheets

US 7,471,133 B1

MODULATOR CIRCUIT WITH LINEAR AND NON-LINEAR CONTROL

CROSS-REFERENCE TO RELATED APPLICATIONS

This application claims the benefit of U.S. Provisional Application Ser. No. 60/807,972, filed on Jul. 21, 2006, which is herein incorporated by reference for all intents and purposes.

BACKGROUND OF THE INVENTION

1. Field of the Invention

The present invention relates to power electronics and power management, and more particularly to a modulator circuit with both linear and non-linear control for providing improved response to fast transients.

2. Description of the Related Art

The load current of a modern central processing unit (CPU) is highly dynamic and changes very quickly from low to high and from high to low. A CPU current transient may occur within 1 microsecond (μs), for example, which is less than the typical switching period of conventional voltage regulators. It is desired to provide a DC-DC power regulator with a control loop that has sufficient response time to fast load transitions whenever they occur. In certain configurations, the compensation network has to be designed to provide relatively aggressive response to turn on all phases for some applications, like low voltage deviation applications. It is desired to compensate for the relatively slow response of the compensation network or otherwise to relax the compensation networks having aggressive response.

BRIEF DESCRIPTION OF THE DRAWINGS

The benefits, features, and advantages of the present invention will become better understood with regard to the following description, and accompanying drawings in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 13:
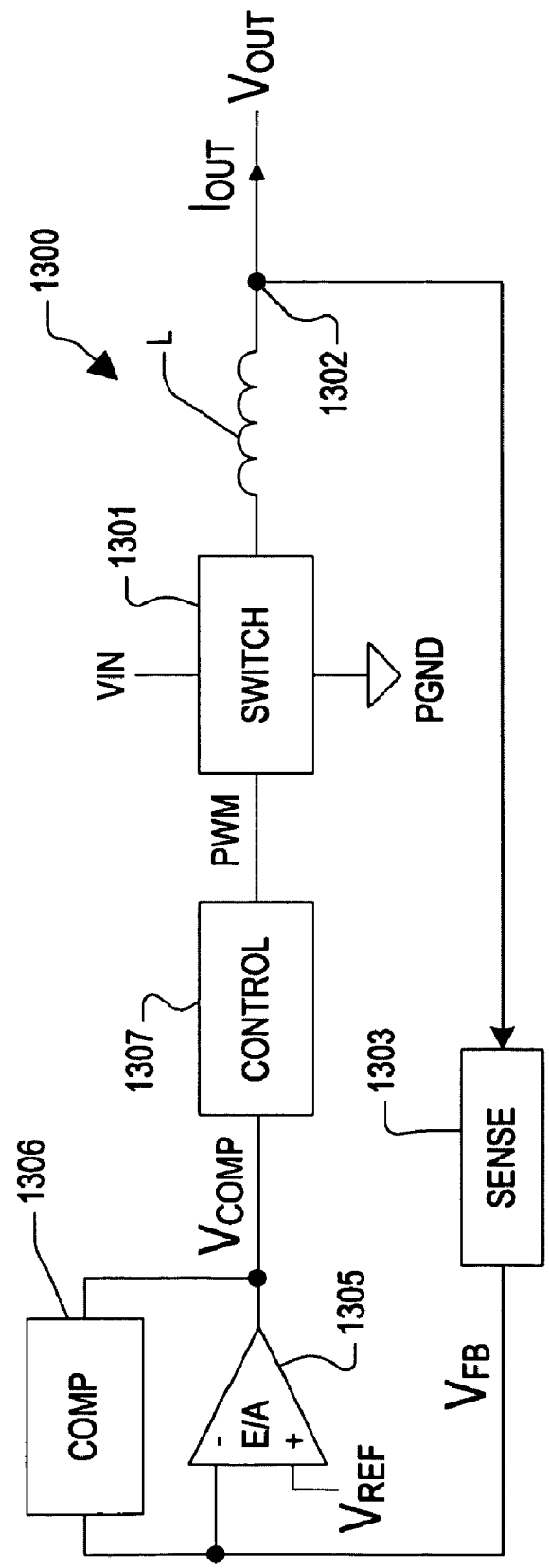
FIG. 13 is a simplified block diagram of a single phase, dual edge, dual ramp modulator implemented according to one embodiment of a prior disclosure.

A dual edge modulator with dual ramps was disclosed in U.S. patent application Ser. No. 11/318,081 entitled "PWM Controller With Dual-Edge Modulation Using Dual Ramps" in which two ramp signals are used for developing a pulse width modulation (PWM) signal used to control the switching cycles of a signal phase or multiphase system. FIG. 13 is a simplified block diagram of a single phase, dual edge, dual ramp modulator 1300 implemented according to one embodiment of the prior disclosure. The PWM signal is provided to the input of a switch circuit 1301, which switches as controlled by the PWM signal to converts an input voltage $V_{IN}$ to an output voltage $V_{OUT}$ via an inductor L. As shown, the switch circuit 1301 is coupled between $V_{IN}$ and power ground (PGND) and switches one end of the inductor L, which develops the $V_{OUT}$ signal at its other end coupled to an output node 1302. An output current $I_{OUT}$ is shown provided from the output node 1302. The illustrated architecture is a buck converter configuration, although other types of modulators are contemplated. The switch circuit 1301 may be implemented according to various methods, such as employing one or more electronic switches, such as metal-oxide semiconductor, field-effect (MOSFET) switches or the like. The $V_{OUT}$ signal is fed back via a sense circuit 1303, which provides a feedback voltage signal $V_{FB}$ to the inverting input of an error amplifier 1305. The $V_{FB}$ signal follows the voltage level of the $V_{OUT}$ signal, although other types of output sense schemes are contemplated. The non-inverting input of the error amplifier 1305 receives a reference voltage $V_{REF}$, and develops a compensation voltage signal $V_{COMP}$ at its output. A feedback compensation circuit 1306 may be provided, such as a resistor-capacitor (RC) circuit or the like, and coupled between the inverting input and output of the error amplifier 1305 as known to those skilled in the art. The $V_{COMP}$ signal is provided to the input of a control circuit 1307, which develops the PWM signal provided to the input of the switch circuit 1301.

Figure 14:
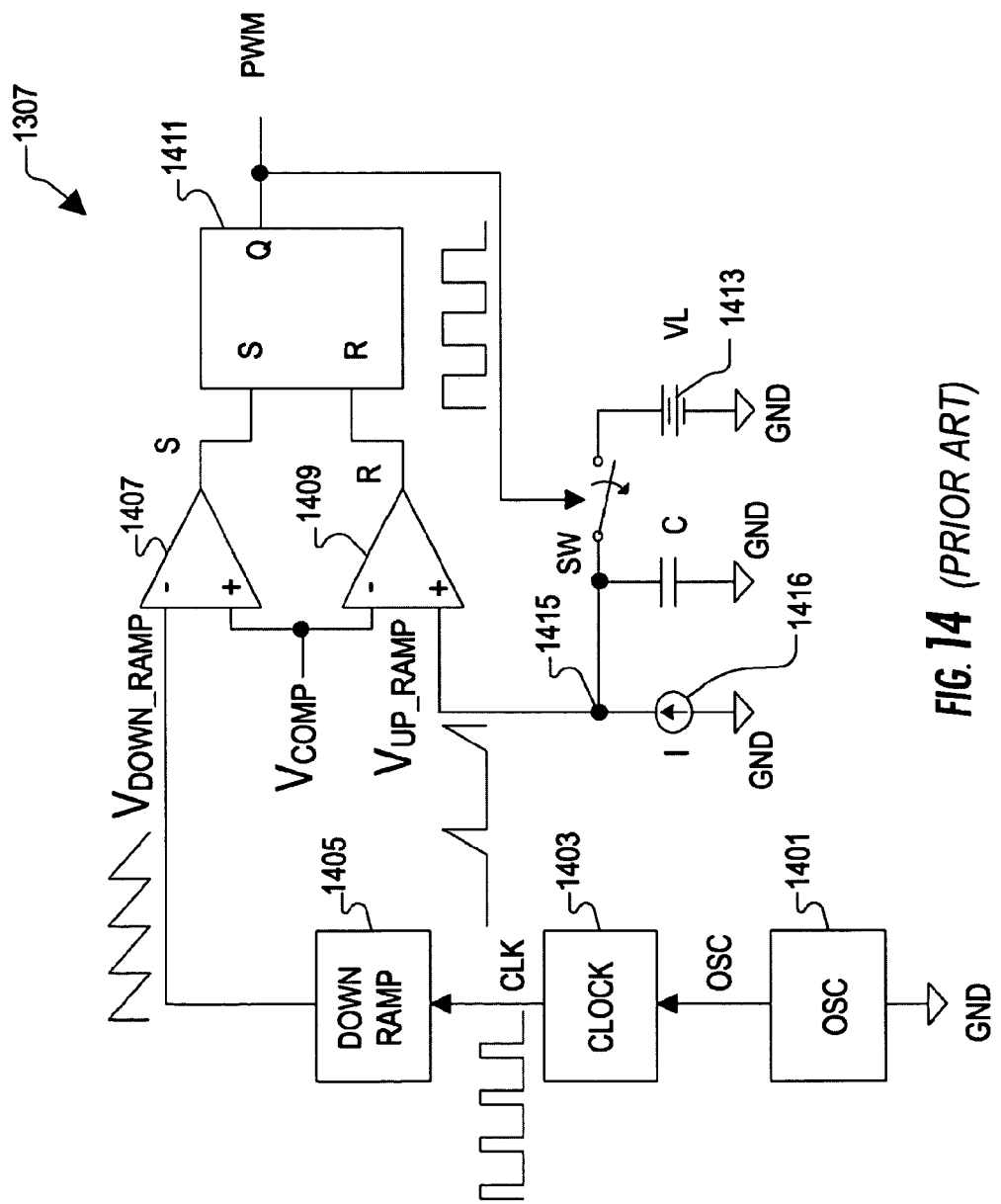
FIG. 14 is a more detailed schematic and block diagram of the control circuit of FIG. 13 in accordance with one embodiment of the prior disclosure.

FIG. 14 is a more detailed schematic and block diagram of the control circuit 1307 in accordance with one embodiment of the prior disclosure. An oscillator circuit 1401 generates an oscillation (OSC) signal at a specified frequency to a clock circuit 1403, which generates a periodic clock signal CLK. The CLK signal is provided to a down ramp circuit 1405, which generates a saw-tooth type down ramp signal $V_{DOWN\_RAMP}$, which is provided to the inverting input of a comparator 1407. The $V_{COMP}$ signal is provided to the non-inverting input of the comparator 1407 and to the inverting input of another comparator 1409. The output of the comparator 1407 provides a set signal S to the set input of a set-reset flip-flop (SRFF) 1411. The comparator 1409 receives an up ramp signal $V_{UP\_RAMP}$ at its non-inverting input, and provides a reset signal R at its output to the reset input of the SRFF 1411. The SRFF 1411 provides the PWM signal at its non-inverting Q output. In the illustrated embodiment, the PWM signal is shown fed back to the control input of a single-pole, single-throw (SPST) switch SW. One terminal of the switch SW receives a voltage VL provided by a voltage source 1413 referenced to signal ground (GND), and the other terminal of the switch SW is coupled to a node 1415 developing the $V_{UP\_RAMP}$ signal. In the illustrated embodiment, a current source 1416 develops current I at its output coupled to the node 1415 and a capacitor C is coupled between node 1415 and GND.

In operation, the $V_{DOWN\_RAMP}$ signal is reset to a high voltage level with every cycle of the CLK signal, such as, for example, every rising edge of CLK. The high voltage level or the peak value of the $V_{DOWN\_RAMP}$ signal is set to a maximum expected level of the $V_{COMP}$ signal during normal operation. After being reset, the $V_{DOWN\_RAMP}$ signal ramps down at a constant rate until reset high by the next cycle of the CLK signal. As soon as the $V_{DOWN\_RAMP}$ signal falls to the level of the $V_{COMP}$ signal, the comparator 1407 asserts the S signal high to set the SRFF 1411, which pulls the PWM signal high. The switch SW is normally closed while the PWM signal is low, so that the capacitor C is initially charged to the voltage level of VL. The voltage of the VL signal is less than or equal to the minimum expected voltage level of the $V_{COMP}$ signal. When the PWM signal goes high, the switch SW is opened allowing the current source 1416 to provide the current I to charge the capacitor C to ramp up the $V_{UP\_RAMP}$ signal on node 1415 at a constant rate. When the voltage of the $V_{UP\_RAMP}$ signal rises to the voltage level of the $V_{COMP}$ signal, the comparator 1409 asserts the R signal high to reset the SRFF 1411, which pulls the PWM signal back low again. When PWM goes low, it closes the switch SW so that the capacitor C is discharged back to the voltage level VL.

In the dual ramp system, the down ramp signal ($V_{DOWN\_RAMP}$) determines the PWM position (or for initiating each PWM pulse) and the up ramp signal ($V_{UP\_RAMP}$) determines the duty cycle (or duration) of each PWM pulse. The down ramp signal serves as a leading edge signal determining activation of the PWM signal and the up ramp signal serves as a trailing edge signal determining termination of each PWM pulse. Activation of the PWM signal is based on the $V_{COMP}$ signal in the control loop of the modulator. The prior disclosure also discusses a multiphase system, in which each phase is implemented in a similar manner as described for the single phase configuration. Each phase includes corresponding up and down ramps (trailing and leading edge ramp signals, respectively) and generates a corresponding one of multiple PWM signals (e.g., see waveforms of FIG. 12). In the multiphase system, all PWM signals may be turned on simultaneously if the voltage of the $V_{COMP}$ signal jumps high enough. For example, if the $V_{COMP}$ signal jumps at or above the predetermined peak-to-peak voltage of the down ramp signal, all phases are turned on simultaneously. The compensation network (e.g., compensation circuit 1306) should be designed with relatively aggressive response to turn on all phases for some applications, like low voltage deviation applications.

Figure 1:
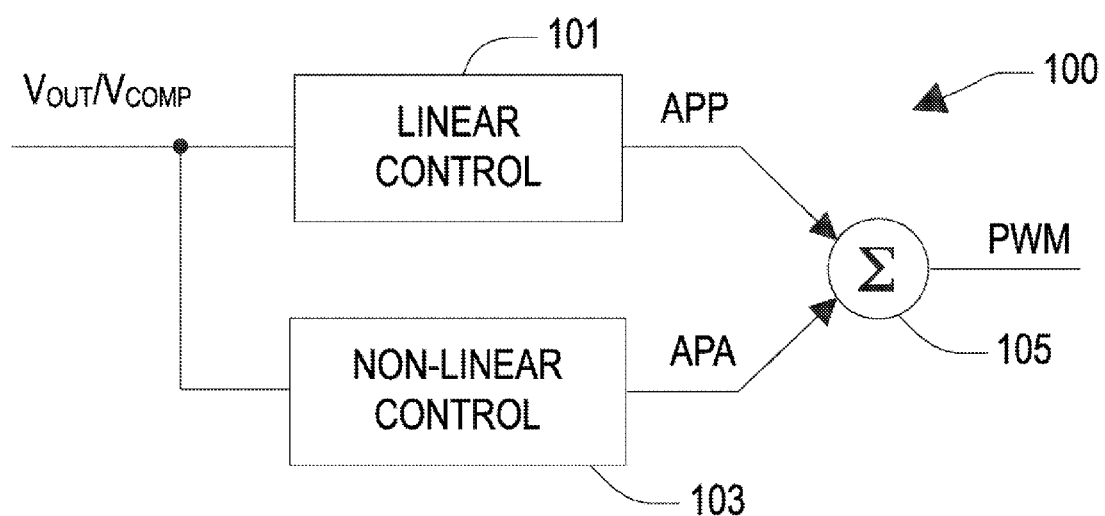
FIG. 1 is a simplified block diagram of a modulator control scheme illustrating parallel linear and non-linear control loops.

FIG. 1 is a simplified schematic and block diagram of a modulator control circuit 100 including two parallel modulator control loops: a linear control loop 101 and a non-linear control loop 103. In this case, to avoid the aggressive compensation design and achieve fast transient response, the non-linear control loop 103 is employed to compensate for the relatively slow compensation network. The inputs of the control loops 101 and 103 receive the $V_{OUT}$ signal or the $V_{COMP}$ signal and/or other information. The linear control loop 101 provides a first or linear control signal APP and the non-linear control loop 103 provides a second or non-linear control signal APA. The APP and APA output signals of the loops 101 and 103 are combined, such as by a combiner 105, to develop a PWM signal used to control the voltage level of $V_{OUT}$. The linear control loop 101 provides suitable control during relatively stable operation with relatively slow or small changes of the $V_{COMP}$ signal. The non-linear control loop 103 triggers the $V_{COMP}$ signal to turn on the PWM signal earlier in the cycle based on the $V_{OUT}$ signal, the $V_{COMP}$ signal, and/or other information. The "other information" may include, for example, the input voltage $V_{IN}$, the output current $I_{OUT}$, etc.

Figure 2:
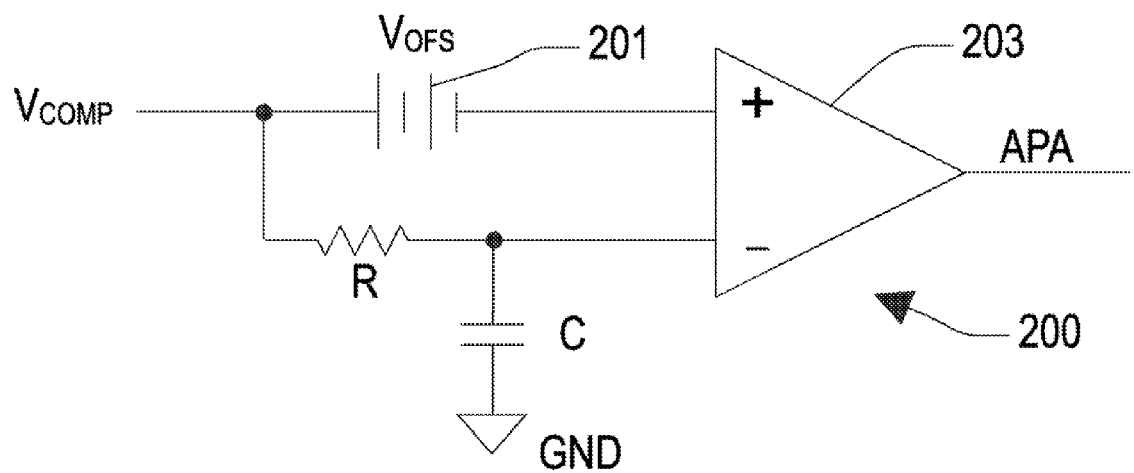
FIG. 2 is a simplified schematic and block diagram illustrating of an exemplary non-linear control scheme.

FIG. 2 is a simplified schematic and block diagram of a modulator control circuit 200 employing an exemplary non-linear control scheme. The $V_{COMP}$ signal is provided to the positive terminal of a voltage source 201, having its negative terminal coupled to the non-inverting input of a comparator 203. The $V_{COMP}$ signal is also provided to one end of a resistor R, having its other end coupled to one end of a capacitor C referenced to GND and to the inverting input of the comparator 203. The voltage source 201 develops an offset voltage $V_{OFS}$. The output of the comparator 203 provides the non-linear control signal APA. In this case, the offset voltage $V_{OFS}$ is subtracted from the compensation signal $V_{COMP}$ and the difference (or $V_{COMP}-V_{OFS}$) is compared with a delayed (filtered, e.g., using a resistor-capacitor or RC circuit as shown) version of the $V_{COMP}$ signal to sense the fast/large transient event, under which condition the output APA signal is pulled high to turn on all phases.

Figure 3:
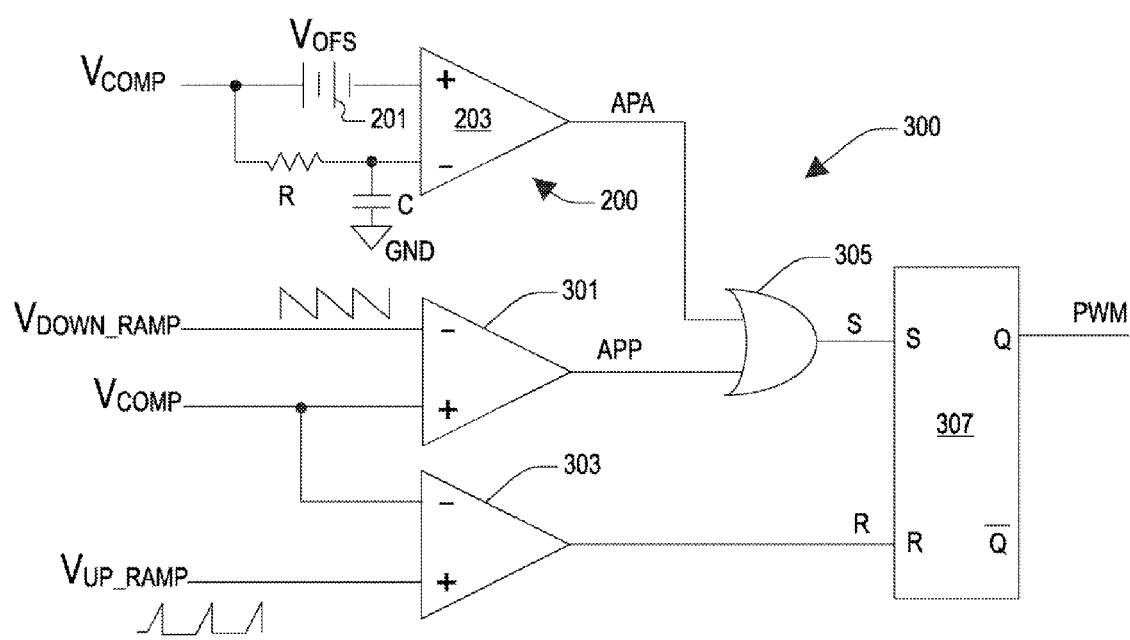
FIG. 3 is a simplified schematic and block diagram of an exemplary dual ramp PWM modulator with linear and non-linear control.

FIG. 3 is a simplified schematic and block diagram of an exemplary dual-ramp PWM modulator control circuit 300 employing both linear control and non-linear control. The modulator control circuit 200 is included within the modulator control circuit 300 for providing the APA signal for the non-linear control portion. The modulator control circuit 300 employs both the down ramp signal $V_{DOWN\_RAMP}$ and the up ramp signal $V_{UP\_RAMP}$ for the linear control portion in a similar manner as previously described. Both of the up and down ramp signals are compared with the $V_{COMP}$ signal using respective comparators 301 and 303 in a similar manner as described for the control circuit 1307. In particular, the $V_{DOWN\_RAMP}$ signal is provided to the inverting input of the comparator 301 and the $V_{UP\_RAMP}$ signal is provided to the non-inverting input of the comparator 303. The $V_{COMP}$ signal is provided to the non-inverting input of the comparator 301 and to the inverting input of the comparator 303. The comparator 301 provides a control signal APP at its output and the comparator 303 provides a reset signal R at its output. The APA and APP signals are provided to respective inputs of a two-input logic OR gate 305, having its output providing a set signal S. The set signal S is provided to the set input of an SRFF 307 and the reset signal R is provided to the reset input of the SRFF 307. The SRFF 307 provides the PWM signal at its non-inverting Q output. Thus, the APA and APP signals are logically OR'd together to provide the set signal S used to set the SRFF 307 to initiate each PWM pulse.

In the linear portion for controlling the APP signal, the up and down ramp signals collectively determine the position and duty cycle of each PWM pulse. When the $V_{DOWN\_RAMP}$ signal falls to the same level as $V_{COMP}$, the APP signal is asserted high which asserts the set signal S high. The S signal sets the SRFF 307, which pulls the PWM signal high. As previously described, each rising ramp on the $V_{UP\_RAMP}$ signal is initiated when the PWM signal goes high, and when the PWM pulse rises to the same level as $V_{COMP}$, the reset signal R resets the SRFF 307 to pull the PWM signal back low and to reset the $V_{UP\_RAMP}$ signal back low. A relatively large transient of the $V_{COMP}$ signal causes the APA signal to rise earlier which thus controls earlier triggering of the PWM signal through operation of the logic OR gate 305.

Figure 4:
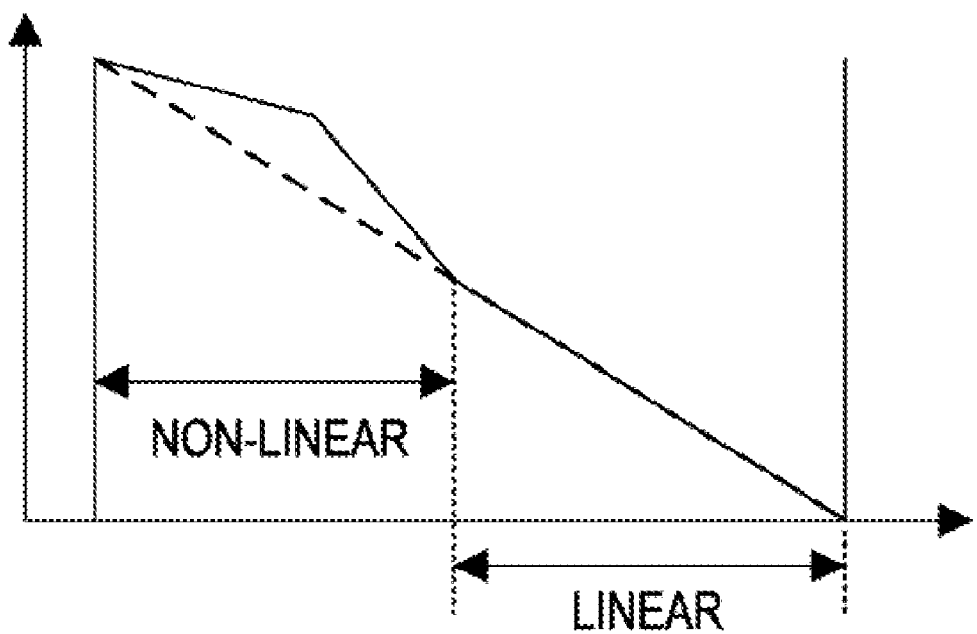
FIGS. 4-7 are timing diagrams of exemplary modifications of the down ramp signal during the non-linear portion of the cycle.
Figure 5:
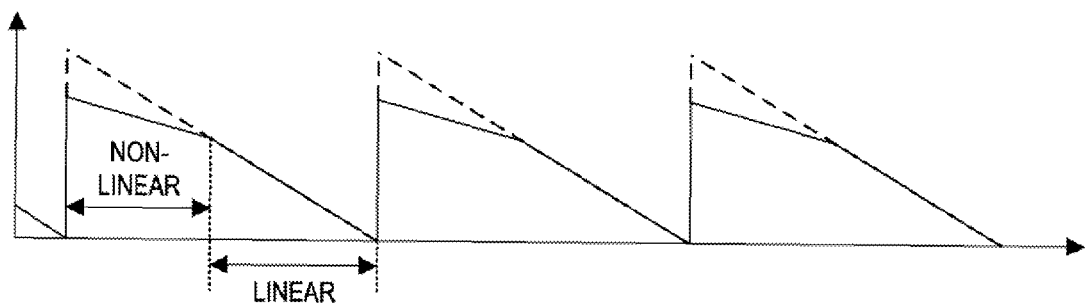
Figure 6:
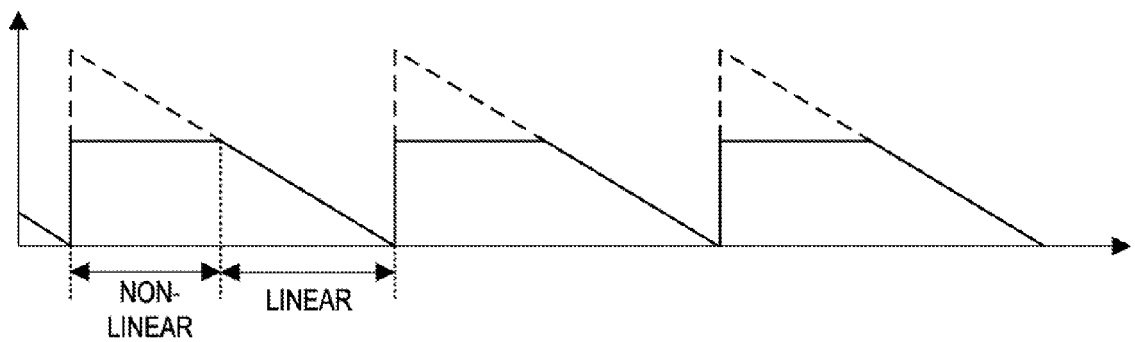
Figure 7:
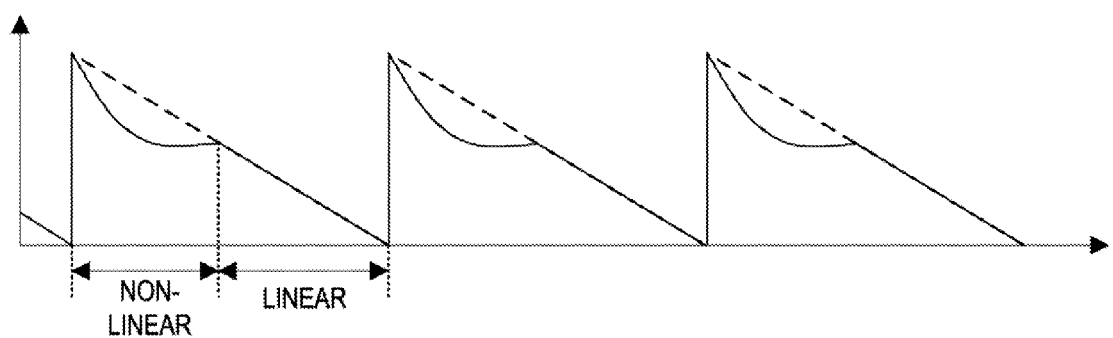

For most low voltage applications, the duty cycle is very small, so there is a relatively large portion of each period of the cycle when the modulator is waiting under the steady state. FIGS. 4-7 are timing diagrams of exemplary modifications of the down ramp signal (e.g., $V_{DOWN\_RAMP}$) during the non-linear portion of the cycle in accordance with various embodiments. In each case, the initial portion of each down ramp cycle is the non-linear portion whereas the remaining portion is the linear portion. Therefore there are two periods in each cycle: the non-linear period and linear period. The original down ramp signals are shown with dashed lines. As shown in FIGS. 4-7, the down ramp waveform during the waiting period for the non-linear control is modified from the standard linearly decreasing down ramp. In FIG. 4, the non-linear portion is increased above the normal level of the down ramp signal and provides an increased slope during the last portion of the non-linear portion. In FIGS. 5-6, the slope of the ramp signal during the non-linear portion is decreased, such as a lower initial voltage with decreased slope (FIG. 5) or a reduced clamped voltage of the upper peak voltage (FIG. 6), otherwise referred to as the "flat-top" waveform. FIG. 7 illustrates an exponentially decaying or curvilinear decrease. In each case, the non-linear period works for the large load change, while the linear period is for the steady state and small load change. In each case, the down ramp in the linear range is the same, while the down ramp during the non-linear range is changed according to any desired waveform format. By decreasing the non-linear portion of the down ramp signal in the dual ramp scheme, the PWM signal is triggered earlier in response to a relatively large transient of the $V_{COMP}$ signal.

The down ramp waveform in the non-linear interval is chosen based on the operational parameters and requirements of the particular application. In exemplary embodiments, the duty cycle of the non-linear interval is adjusted to maintain the proper range of the linear interval for the stable operation based on the input/output voltage, output current and voltage of the compensation signal. The non-linear control can be automatically carried out without an extra comparator.

Figure 8:
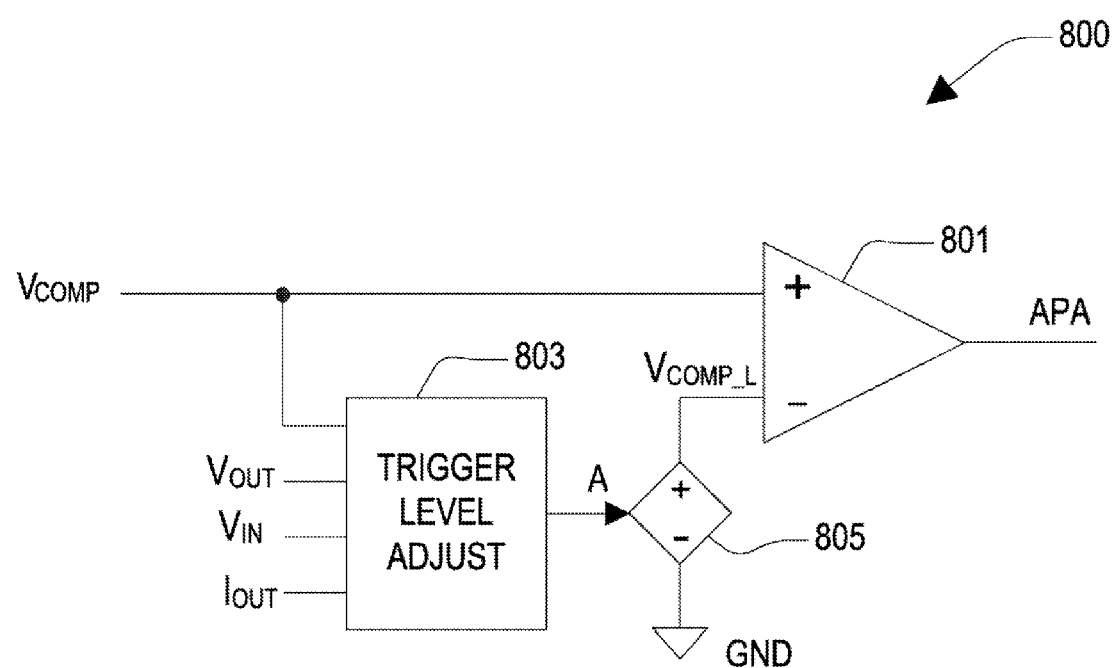
FIG. 8 is a simplified schematic and block diagram illustrating an exemplary method of non-linear control by adjusting trigger level of the compensation signal.

FIG. 8 is a simplified schematic and block diagram of a modulator control circuit 800 illustrating an exemplary method of non-linear control by adjusting trigger level of the compensation signal. The $V_{COMP}$ signal is provided to the non-inverting input of a comparator 801 and to one input of a trigger level adjust circuit 803. The trigger level adjust circuit 803 receives various other signals, such as output voltage $V_{OUT}$, input voltage $V_{IN}$, output current $I_{OUT}$, etc., and provides an adjust signal A to the adjust input of an adjustable voltage source 805. The adjustable voltage source 805 develops a compensation threshold signal $V_{COMP\_L}$ provided to the inverting input of the comparator 801. The compensation threshold signal $V_{COMP\_L}$ signal is a limited or adjusted version of the $V_{COMP}$ signal. The comparator 801 outputs the non-linear control signal APA. As illustrated by the modulator control circuit 800, the $V_{COMP\_L}$ signal, which defines the upper threshold level for the $V_{COMP}$ signal, is based on the output/input voltage ($V_{IN}$, $V_{OUT}$), output current ($I_{OUT}$), $V_{COMP}$ signal (and/or any other suitable parameters). These parameters adjust the voltage level of the $V_{COMP\_L}$ signal, which is compared with the $V_{COMP}$ signal for providing the non-linear control signal APA. If the voltage of the $V_{COMP}$ signal jumps above the threshold level of $V_{COMP\_L}$, the non-linear control output signal APA is triggered.

Figure 9:
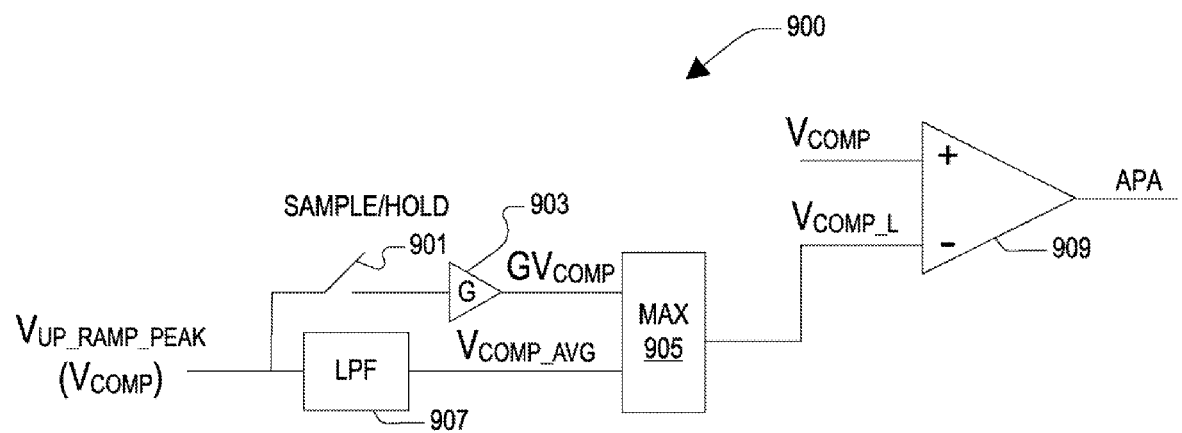
FIG. 9 is a simplified schematic and block diagram illustrating another exemplary embodiment method of control by adjusting trigger level of the compensation signal.

FIG. 9 is a simplified schematic and block diagram of another modulator control circuit 900 illustrating another exemplary embodiment method of control by adjusting trigger level of the compensation signal, in which case the $V_{COMP}$ signal is actively adjusted. In this case, the peak level (shown as $V_{UP\_RAMP}$ PEAK) of the up ramp signal $V_{UP\_RAMP}$ is sampled and held every switching cycle by sample and hold circuit 901 and gain adjusted by a gain block 903 with gain G to provide a signal $GV_{COMP}$. The $GV_{COMP}$ signal is provided to one input of a maximum function block (MAX) 905. It is noted that the $V_{UP\_RAMP\_PEAK}$ signal is equivalent to the level of the $V_{COMP}$ signal during each cycle since the up ramp signal peaks at the level of $V_{COMP}$ and is then pulled back low. In an alternative embodiment, the $V_{COMP}$ signal may be used in which case the sample and hold circuit 901 may be omitted. The $V_{UP\_RAMP\_PEAK}$ signal is also provided to an input of a low-pass filter (LPF) 907, which outputs an average value of the $V_{COMP}$ signal over time, shown as a signal $V_{COMP\_AVG}$. The $V_{COMP\_AVG}$ signal is provided to another input of the MAX block 905. The MAX block 905 outputs the $V_{COMP\_L}$ signal as the maximum of either one of the $GV_{COMP}$ and the $V_{COMP\_AVG}$ signals. The $V_{COMP\_L}$ and $V_{COMP}$ signals are provided to the non-inverting and inverting inputs, respectively, of a comparator 909 providing the APA signal at its output.

Figure 10:
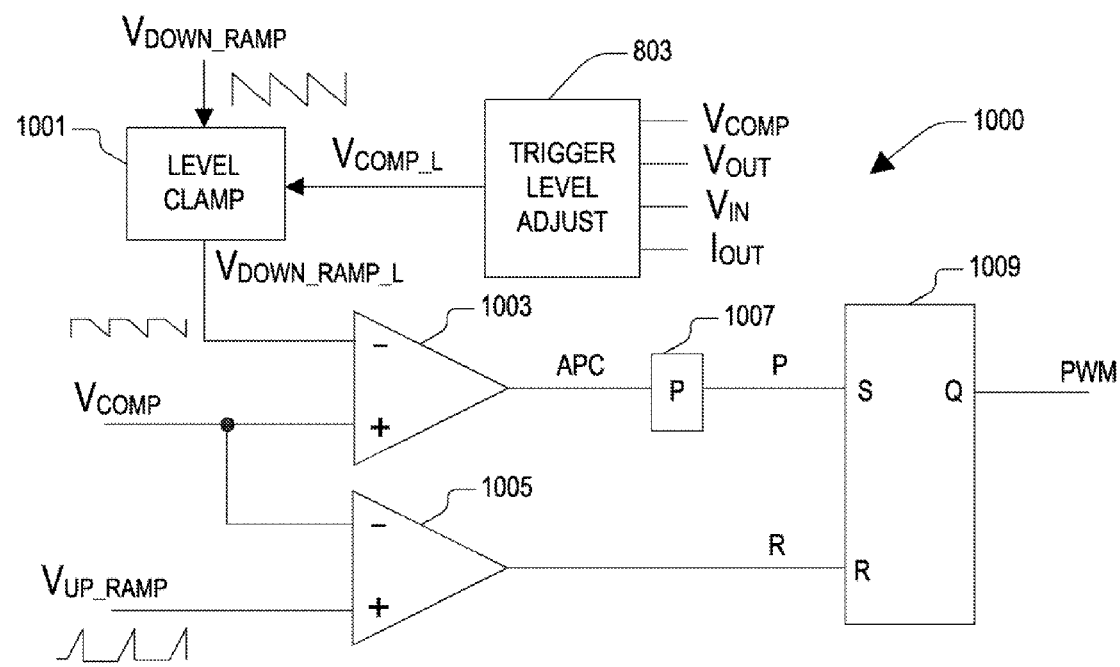
FIG. 10 is a simplified schematic and block diagram of an exemplary dual ramp modulation circuit with a clamp of the down ramp signal for non-linear control.

FIG. 10 is a simplified schematic and block diagram of an exemplary dual ramp modulation control circuit 1000 which clamps the down ramp signal for non-linear control. In this case, the flat-top waveform developed by the trigger level adjust circuit 803 (and as shown in FIG. 6) by clamping the maximum peak of the down ramp signal $V_{DOWN\_RAMP}$ to the threshold $V_{COMP\_L}$ signal. In this case, the non-linear control is carried out by the dual ramp PWM modulation scheme similar to that shown in FIG. 3. In particular, the $V_{COMP\_L}$ signal is provided to a control input of a level clamp circuit 1001 receiving the $V_{DOWN\_RAMP}$ signal at another input. The level clamp circuit 1001 clamps the $V_{DOWN\_RAMP}$ signal to a peak value determined by the threshold $V_{COMP\_L}$ signal to provide a flat-top ramp signal $V_{DOWN\_RAMP\_L}$ to the inverting input of a comparator 1003. The $V_{COMP}$ signal is provided to the non-inverting input of the comparator 1003 and to the inverting input of another comparator 1005. The $V_{UP\_RAMP}$ signal is provided to the non-inverting input of the comparator 1005. The comparator 1003 outputs a combination linear/non-linear control signal APC to the input of a pulse circuit 1007, which outputs a pulse signal P to the set input of a SRFF 1009. The comparator 1005 outputs the reset signal R to the reset input of the SRFF 1009, which outputs the PWM signal at its non-inverting Q output. The combination (linear and non-linear) control signal APC combines the functions of both non-linear and linear control. The pulse circuit 1007 ensures that the set input of the SRFF 1009 is reset back to a logic zero level prior to the reset input going high.

Figure 11:
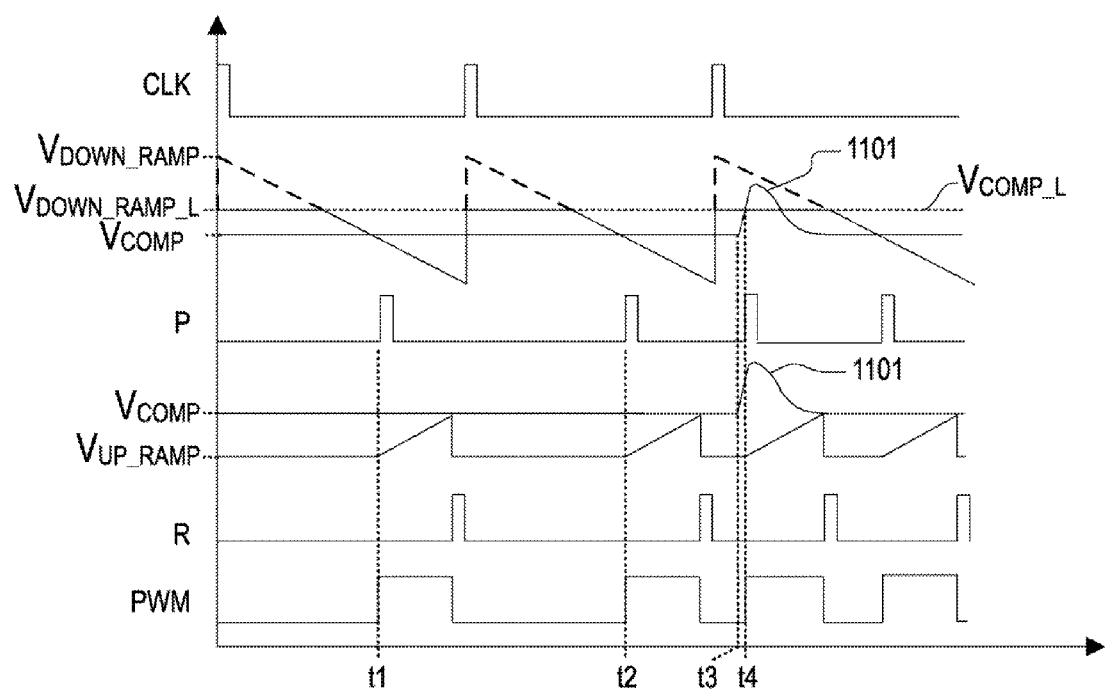
FIG. 11 is a timing diagram illustrating operation of the dual ramp modulation circuit of FIG. 10.

FIG. 11 is a timing diagram illustrating operation of the dual ramp modulation control circuit 1000 of FIG. 10. As illustrated in FIG. 11, linear control dominates while the $V_{COMP}$ signal remains below the $V_{COMP\_L}$ signal level. The CLK signal is shown at top and resets the $V_{DOWN\_RAMP}$ signal high with every clock pulse. The $V_{DOWN\_RAMP}$ signal is shown with dashed lines superimposed with the $V_{DOWN\_RAMP\_L}$ signal clamped at the voltage level of the $V_{COMP\_L}$ signal. The $V_{COMP}$ signal is superimposed onto the $V_{DOWN\_RAMP\_L}$ signal to show relative signal levels. The P signal is shown next which pulses high when the $V_{DOWN\_RAMP\_L}$ signal falls below the $V_{COMP}$ signal. The $V_{UP\_RAMP}$ signal is shown next superimposed with the $V_{COMP}$ signal. The $V_{UP\_RAMP}$ signal begins ramping up from a lower reset level in response to each pulse of the P signal. The reset signal R is shown next which pulses high when the $V_{UP\_RAMP}$ signal rises to the voltage level of the $V_{COMP}$ signal, where each pulse of the R signal causes the $V_{UP\_RAMP}$ signal to be reset back to the lower reset level. The PWM signal goes high in response to pulses of the P signal and is reset back low in response to pulses of the R signal.

Linear operation is illustrated while the $V_{COMP}$ signal remains below the voltage level of the $V_{COMP\_L}$ signal as shown at times t1 and t2 during the linear portions of the $V_{DOWN\_RAMP\_L}$ signal. Non-linear operation is illustrated by a transient 1101 occurring on the $V_{COMP}$ signal beginning at a time t3 early in the corresponding PWM cycle in which the $V_{COMP}$ signal pulses high. When the $V_{COMP}$ signal rises above the $V_{DOWN\_RAMP\_L}$ signal as clamped at the level of the $V_{COMP\_L}$ signal just after time t3 at a time t4, the P signal pulses high early in the cycle causing the PWM signal to go high early in the cycle at about time t4. The $V_{COMP}$ signal falls back low again relatively quickly, and the current PWM signal goes back low when the $V_{UP\_RAMP}$ signal rises to the voltage level of the $V_{COMP}$ signal. It is noted that the pulse on the $V_{COMP}$ signal does not rise to the level of the original $V_{DOWN\_RAMP}$ signal, so that the pulse on the $V_{COMP}$ signal would otherwise be completely missed without non-linear operation. In particular, the $V_{DOWN\_RAMP\_L}$ signal, which is clamped to the voltage level of the $V_{COMP\_L}$ signal, allows detection of the transient 1101 and response thereto.

Figure 12:
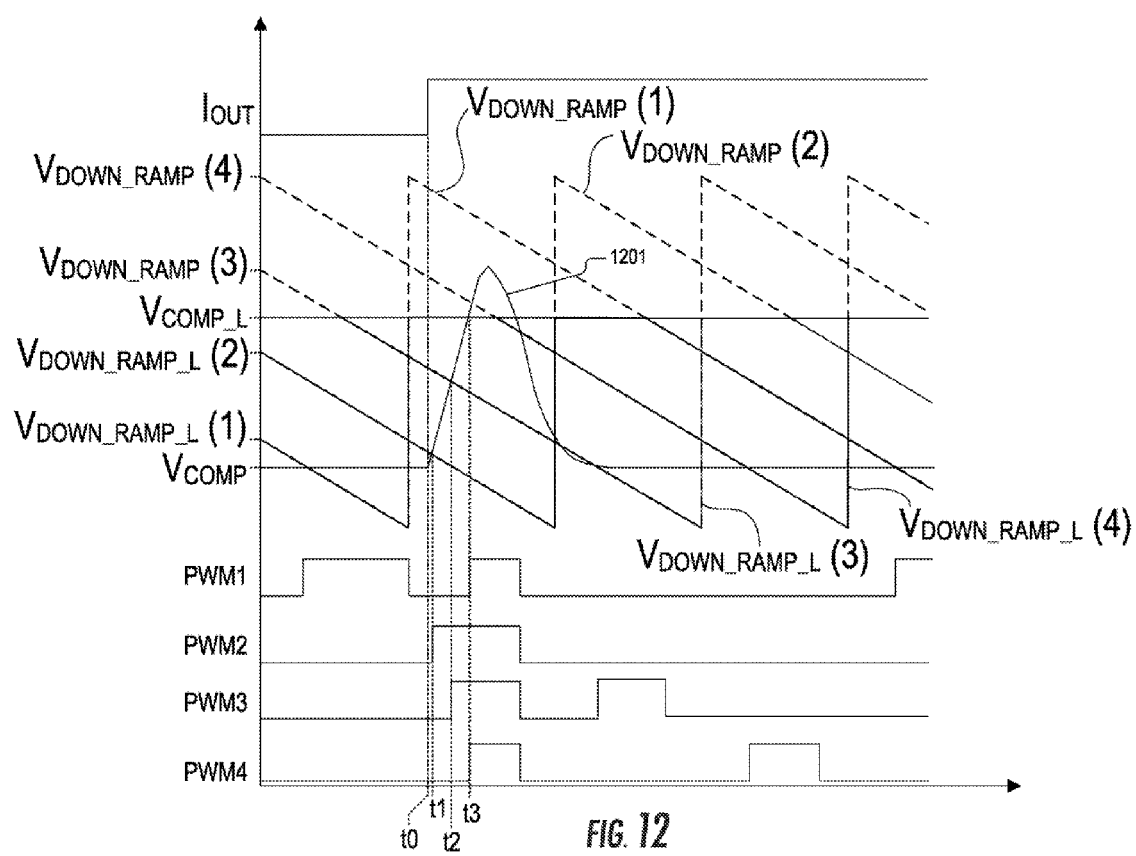
FIG. 12 is a timing diagram illustrating operation of a multiphase system employing the dual ramp modulation circuit of FIG. 10 for each phase.

FIG. 12 is a graph diagram illustrating operation of a multiphase system (not shown) employing the dual ramp modulation circuit of FIG. 10 for each phase of the multiphase system. The graph diagram plots the $I_{OUT}$ signal along with the down ramp signals (four phases), the $V_{COMP}$ signal, and the corresponding four PWM signals PWM1, PWM2, PWM3 and PWM4. The down ramp signals include four basic $V_{DOWN\_RAMP}$ signals $V_{DOWN\_RAMP}$ (1)-(4) shown with dashed lines superimposed with the corresponding $V_{DOWN\_RAMP\_L}$ (1)-(4) signals capped at the voltage level of the $V_{COMP\_L}$ signal. In this case, the output current $I_{OUT}$ jumps high at an initial time t0 causing a transient 1201 on the $V_{COMP}$ signal. The transient 1201 causes a sharp rise of the $V_{COMP}$ signal which almost immediately rises to the level of the falling $V_{DOWN\_RAMP\_L}$ (2) signal causing the corresponding PWM2 signal to go high at about time t1. As the $V_{COMP}$ signal continues to rise sharply, it intersects the falling level of the $V_{DOWN\_RAMP\_L}$ (3) signal casing the corresponding PWM3 signal to go high at about time t2. The $V_{COMP}$ signal reaches the voltage level of the $V_{DOWN\_RAMP\_L}$ (1) and $V_{DOWN\_RAMP\_L}$ (4) signals clamped at $V_{COMP\_L}$ at about time t3, so that the PWM1 and PWM4 signals are asserted high at time t3.

A modulator control circuit according to one embodiment includes a linear control circuit, a non-linear control circuit, and a combiner. The linear control circuit has an input receiving a compensation signal indicative of an output parameter and an output providing a first control signal. The non-linear control circuit has an input receiving the compensation signal and an output providing a second control signal. The non-linear control circuit senses transients of the compensation signal not otherwise detected by the linear control circuit and asserts the second control signal indicative thereof. The combiner combines the first and second control signals to provide a pulse width modulation (PWM) signal for controlling the output parameter, such as output voltage or the like.

Various embodiments are contemplated for the non-linear control circuit. In one configuration, the non-linear control circuit includes a comparator which compares a difference signal (compensation signal minus an offset voltage) with a delayed version of the compensation signal. In another embodiment, an adjustable voltage source is used to provide an adjusted or limited compensation signal compared with the original compensation signal. The voltage source is adjusted based on a trigger level adjust circuit, which adjusts the compensation signal based on other information, such as at least one of output voltage and output current. In another embodiment, the adjusted compensation signal is based on a maximum of an amplified compensation signal and an average compensation signal. The non-linear control portion decreases delay in the feedback loop in response to transients and enables more than one PWM pulse in a single switching cycle.

In a dual ramp, dual edge configuration, the linear control circuit includes a first ramp circuit which provides a leading edge ramp signal (e.g., down ramp) synchronous with a clock signal, a first comparator which compares the leading edge ramp signal with the compensation signal and which asserts the first control signal indicative thereof, a second ramp circuit which provides a trailing edge ramp signal (e.g., up ramp) that begins ramping when the PWM signal is asserted, and a second comparator which compares the trailing edge ramp signal with the compensation signal and which generates a reset signal indicative thereof. In this case, the combiner may include a logic gate (e.g., an OR gate or the like) having inputs receiving the first and second control signals and an output which provides a set signal indicative thereof, and a logic circuit (e.g., a latch or flip-flop or the like) which asserts the PWM signal when the set signal is asserted and which de-asserts the PWM signal when the reset signal is asserted.

A modulator control circuit according to another embodiment includes first and second ramp circuits, an adjust circuit, first and second comparator circuits, and a logic circuit. The first ramp circuit provides a leading edge ramp signal synchronous with a clock signal. The adjust circuit adjusts the leading edge ramp signal to provide an adjusted leading edge signal. The first comparator compares the adjusted leading edge ramp signal with a compensation signal indicative of an output parameter and asserts a control signal indicative thereof. The logic circuit asserts a PWM signal when the control signal is asserted and which de-asserts the PWM signal when a reset signal is asserted. The second ramp circuit provides a trailing edge ramp signal that begins ramping when the PWM signal is asserted. The second comparator compares the trailing edge ramp signal with the compensation signal and generates the reset signal indicative thereof. The adjustment of the leading edge ramp signal provides a non-linear functionality which decreases delay in the feedback loop in response to transients and enables more than one PWM pulse in a single switching cycle.

In one embodiment, the adjust circuit changes a slope of an initial portion of the leading edge ramp signal. In one embodiment, the adjust circuit includes a clamp circuit which limits a peak level of the leading edge ramp signal to a predetermined level. The predetermined level may be adjusted based on any combination of the output voltage and output current or other information.

A method of controlling a modulator according to an embodiment of the present invention includes providing a leading edge ramp signal synchronous with a clock signal, adjusting the leading edge ramp signal to provide an adjusted leading edge ramp signal, comparing a compensation signal indicative of an output condition with the adjusted leading edge ramp signal and providing a set signal indicative thereof, providing a trailing edge ramp signal which ramps while a PWM signal is asserted, comparing the trailing edge ramp signal with the compensation signal and providing a reset signal indicative thereof, and asserting the PWM signal when the set signal is provided and de-asserting the PWM signal when the reset signal is provided. The adjustment of the leading edge ramp signal provides a non-linear functionality which decreases delay in the feedback loop in response to transients and enables more than one PWM pulse in a single switching cycle.

The method may include changing a slope of an initial portion of the leading edge ramp signal. The method may include clamping the leading edge ramp signal to a predetermined level. The method may include determining the predetermined level based on adjusting the compensation signal based on any combination of output voltage and output current. The method may include providing a down ramp signal and providing an up ramp signal.

Although the present invention has been described in considerable detail with reference to certain preferred versions thereof, other versions and variations are possible and contemplated. For example, although various embodiments are illustrated using dual edge, dual ramp configurations, the present invention applies to alternative linear control methods. Those skilled in the art should appreciate that they can readily use the disclosed conception and specific embodiments as a basis for designing or modifying other structures for providing out the same purposes of the present invention without departing from the spirit and scope of the invention as defined by the following claims.

The invention claimed is:

1. A modulator control circuit, comprising:
a first ramp circuit which provides a leading edge ramp signal synchronous with a clock signal;
an adjust circuit which adjusts said leading edge ramp signal to provide an adjusted leading edge signal;
a first comparator which compares said adjusted leading edge ramp signal with a compensation signal indicative of an output parameter and which asserts a control signal indicative thereof;
a logic circuit which asserts a pulse width modulation (PWM) signal when said control signal is asserted and which de-asserts said PWM signal when a reset signal is asserted;
a second ramp circuit which provides a trailing edge ramp signal that begins ramping when said PWM signal is asserted; and
a second comparator which compares said trailing edge ramp signal with said compensation signal and which generates said reset signal indicative thereof.

2. The modulator control circuit of claim 1, wherein said adjust circuit changes a slope of an initial portion of said leading edge ramp signal.

3. The modulator control circuit of claim 1, wherein said adjust circuit comprises a clamp circuit which limits a peak level of said leading edge ramp signal to a predetermined level.

4. The modulator control circuit of claim 3, further comprising a trigger level adjust circuit having an input receiving said compensation signal and an output providing a compensation limit signal to said clamp circuit, wherein said predetermined level is based on said compensation limit signal.

5. The modulator control circuit of claim 4, wherein said trigger level adjust circuit determines said compensation limit signal by adjusting said compensation signal based on any combination of said output voltage and output current.

6. The modulator control circuit of claim 1, wherein said first ramp circuit comprises a down ramp generator and wherein said second ramp circuit comprises an up ramp generator.

7. A method of controlling a modulator, comprising:
providing a leading edge ramp signal synchronous with a clock signal;
adjusting the leading edge ramp signal to provide an adjusted leading edge ramp signal;
comparing a compensation signal indicative of an output condition with the adjusted leading edge ramp signal and providing a set signal indicative thereof;
providing a trailing edge ramp signal which ramps while a pulse width modulation (PWM) signal is asserted;
comparing the trailing edge ramp signal with the compensation signal and providing a reset signal indicative thereof; and
asserting the PWM signal when the set signal is provided and de-asserting the PWM signal when the reset signal is provided.

8. The method of claim 7, wherein said adjusting the leading edge ramp signal comprises changing a slope of an initial portion of the leading edge ramp signal.

9. The method of claim 7, wherein said adjusting the leading edge ramp signal comprises clamping the leading edge ramp signal to a predetermined level.

10. The method of claim 9, further comprising determining the predetermined level based on adjusting the compensation signal based on any combination of output voltage and output current.

11. The method of claim 7, wherein said providing a leading edge ramp signal comprises providing a down ramp signal and wherein said providing a trailing edge ramp signal comprising providing an up ramp signal.

* * * * *